(12) United States Patent
Michael et al.

(10) Patent No.: US 8,787,012 B2
(45) Date of Patent: Jul. 22, 2014

(54) HARD DRIVE RETENTION MECHANISM

(75) Inventors: Amir Meir Michael, San Mateo, CA (US); Steven J. Furuta, Santa Clara, CA (US); Michael Wittig, Santa Clara, CA (US)

(73) Assignee: Facebook, Inc., Menlo Park, CA (US)

( * ) Notice: Subject to any disclaimer, the term of this patent is extended or adjusted under 35 U.S.C. 154(b) by 387 days.

(21) Appl. No.: 13/029,457

(22) Filed: Feb. 17, 2011

(65) Prior Publication Data

US 2012/0212899 A1 Aug. 23, 2012

(51) Int. Cl.
*H05K 5/00* (2006.01)
*H05K 7/00* (2006.01)
*H05K 7/16* (2006.01)
*H01R 13/62* (2006.01)
*G06F 1/18* (2006.01)
*H05K 7/14* (2006.01)

(52) U.S. Cl.
CPC .............. *H05K 7/1487* (2013.01); *G06F 1/187* (2013.01)
USPC ............ 361/679.37; 361/679.34; 361/679.35; 361/379.39; 361/726; 361/727; 439/154; 439/157

(58) Field of Classification Search
USPC ................. 361/679.31–679.4, 679.55–679.6, 361/724–727, 679.02, 679.03; 439/60, 439/151–160, 327, 328, 331, 638
See application file for complete search history.

(56) References Cited

U.S. PATENT DOCUMENTS

| | | | | |
|---|---|---|---|---|
| 5,192,143 | A * | 3/1993 | Lajara et al. | 403/24 |
| 2007/0070595 | A1 * | 3/2007 | Chen et al. | 361/685 |
| 2011/0122577 | A1 * | 5/2011 | Sun | 361/679.58 |

* cited by examiner

*Primary Examiner* — Jenny L Wagner
*Assistant Examiner* — Jerry Wu
(74) *Attorney, Agent, or Firm* — Fenwick & West LLP

(57) ABSTRACT

An efficient and quick mechanism provides for retention and removal of hard drives on a computer chassis. A hard drive is placed in a hard drive housing, which includes one or more pins on the outside of the housing and a opening on a side of the housing. The pins on the hard drive housing align with and fit inside slots located on the chassis. The chassis also includes a spring plunger that inserts into the opening of the hard drive housing. The insertion of the spring plunger into the opening of the hard drive housing secures the housing to the chassis. The pins can be uncoupled from the slots and the spring plunger can be released from the opening to quickly remove the hard drive housing from the chassis.

23 Claims, 5 Drawing Sheets

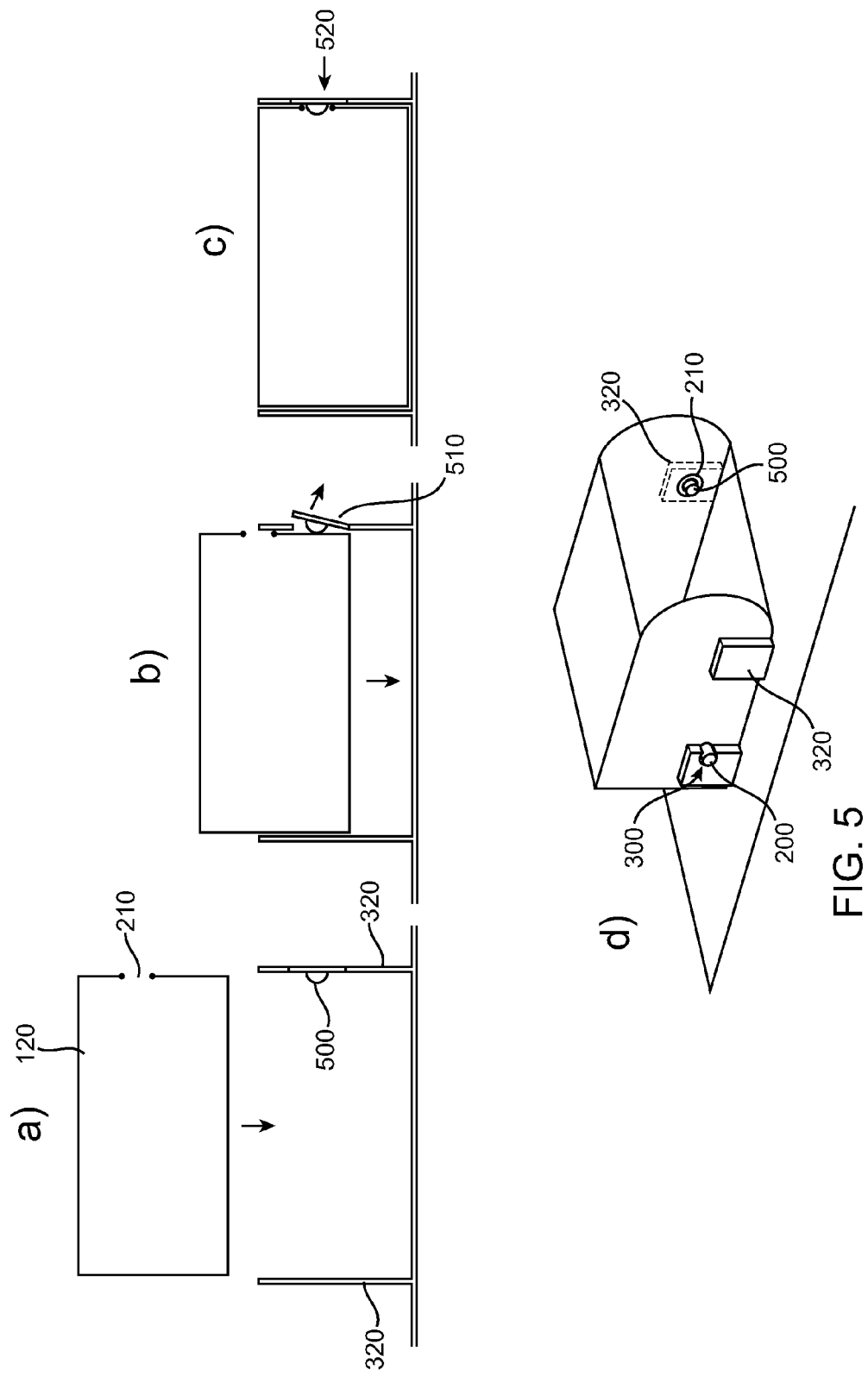

HARD DRIVE RETENTION MECHANISM

BACKGROUND

This invention relates generally to a computer system chassis having a retention mechanism for a hard drive in the chassis.

Conventionally, a hard drive is inserted into a hard drive housing using rails to guide the hard drive into the housing. The hard drive housing is secured to a chassis by manually securing the hard drive housing with screws. Each time a hard drive is to be removed, the hard drive housing must be unscrewed. This process can be time-consuming and cumbersome each time mounting or removal of a hard drive is required. The process can also be costly if a technician is paid for the time spent to install or remove the hard drive from the chassis. Thus, there is a need for an efficient and quick removal and retention mechanism for hard drives in computer server systems.

SUMMARY

To enhance the efficiency of the installation and removal of hard drives, embodiments of the invention provide a quick and easy retention mechanism for hard drives in computer systems. The hard drive is enclosed in a hard drive housing, which is then placed on a computer chassis. The hard drive housing is equipped with one or more pins that protrude from the exterior of the housing. In some embodiments, the hard drive housing has two pins, where each pin is located on an opposite side of the hard drive housing. In other embodiments, the pins are located on the lower, back-end of the hard drive housing.

In some embodiments, the chassis includes one or more slots for receiving the one or more pins. Each pin is coupled to a slot. In certain embodiments, the diameter of the slot is not larger than the diameter of the pin, and the friction between the pin and the slot create an interference fit, which secures the housing to the chassis.

In another embodiment, the chassis includes a spring plunger, which aligns with an opening in the hard drive housing. The spring plunger is inserted into the opening to secure the housing to the chassis. In some embodiments, there are one or more spring plungers and one or more openings in the hard drive housing. In another embodiment, a resilient notch attached to the chassis can be used to removably secure the housing to the chassis. The resilient notch aligns with the opening in the housing to secure the housing to the chassis, and it can be easily pulled back to release the housing from the chassis.

BRIEF DESCRIPTION OF THE DRAWINGS

FIGS. 5a-d illustrate the retention mechanism comprising a resilient notch, in accordance with one embodiment of the invention.

The figures depict various embodiments of the present invention for purposes of illustration only. One skilled in the art will readily recognize from the following discussion that alternative embodiments of the structures and methods illustrated herein may be employed without departing from the principles of the invention described herein.

DETAILED DESCRIPTION

A variety of electronic and computing devices or components require a retention mechanism for use in computer systems, such as in server assemblies, server racks, hard-drive arrays, personal computers, or any other computer system where electronic or computer devices must be secured and removed on a chassis.

Figure 1:
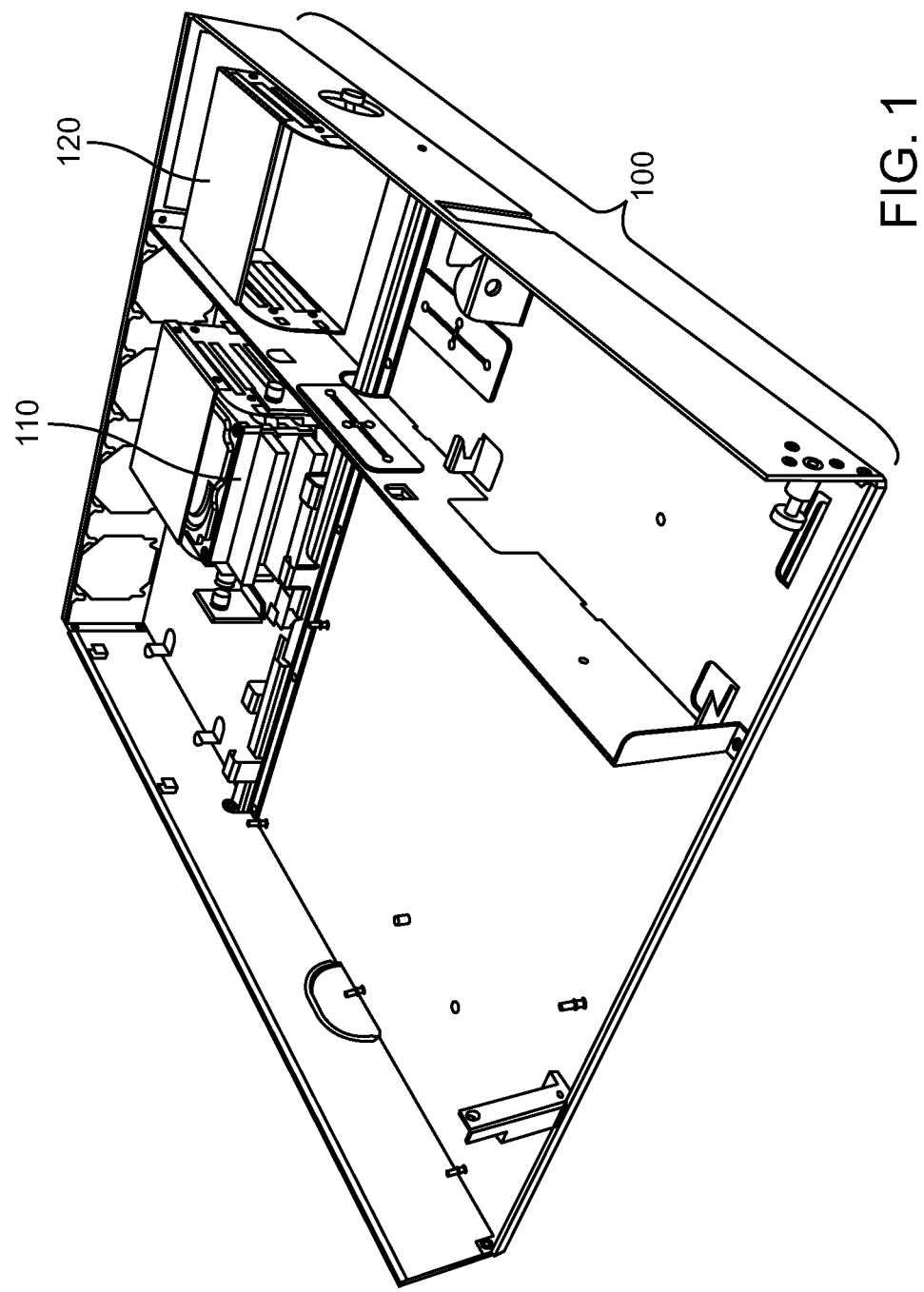
FIG. 1 is overhead perspective view of a chassis in a computer server system, in accordance with one embodiment of the invention.

FIG. 1 shows an example of a chassis 100 in a computer system. In some embodiments, the chassis 100 is a rigid frame that is made up of a plurality of walls or panels. The chassis 100 can be designed to hold a mother board, memory devices, microprocessors, hard drives 110, and/or other computing equipment or devices. In certain embodiments, the chassis 100 is part of a server, which is a central computer or group of computers dedicated to sending and receiving data from other computers on a network. As shown in FIG. 1, the chassis 100 can have a plurality of walls or panels, such as a base panel, two side panels and a back panel. The chassis 100 can include one or more hard drives 110, which are enclosed in hard drive housings 120.

Figure 2:
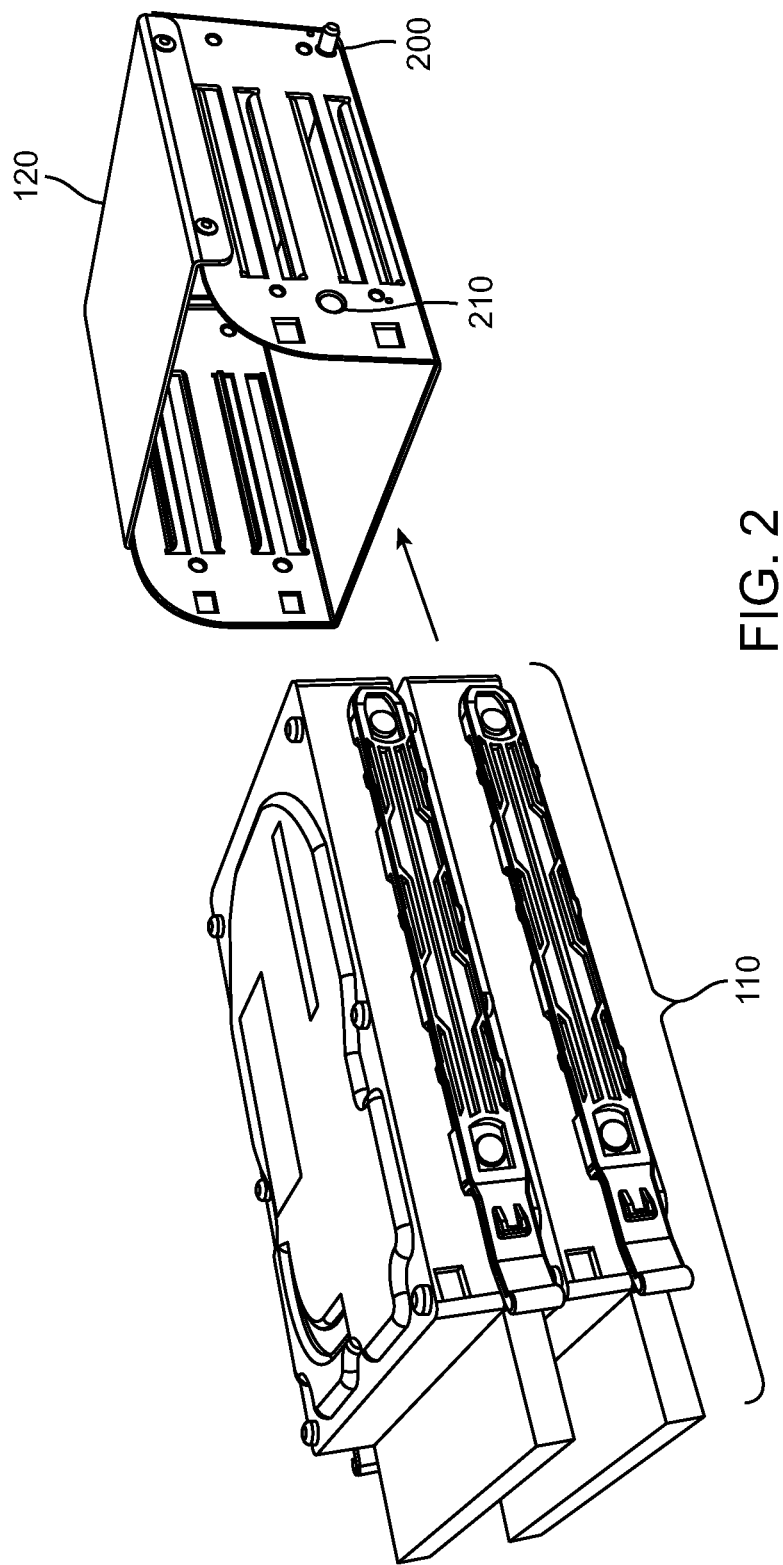
FIG. 2 is a perspective view of a hard drive and hard drive housing, in accordance with one embodiment of the invention.

FIG. 2 depicts an exemplary hard drive 110 and a hard drive housing 120. In some embodiments, the hard drive 110 (or hard disk drive) is a mechanism that controls the positioning, reading, and writing of the data on the hard disk. In some embodiments, the hard drive housing 120 comprises a base panel, a back panel, a top panel, two side panels, and an opening at the front end for receiving a hard drive 110. The hard drive housing 120 can also be called a cage or hard drive carrier. In some embodiments, the hard drive 110 includes rails mounted on the side of the hard drive 110. The rails on the side of the hard drive 110 align with rail slots or guides in the interior of the hard drive housing 120 and enable the hard drive 110 to slide into the rail slots or guides.

In some embodiments, the hard drive housing 120 comprises a pin 200 that is located on the side panel of the housing 120. In one embodiment, the pin 200 is a small, cylindrical protrusion that extends out from the frame of the hard drive housing 120. The pin 200 can be located at the lower, back end of the hard drive housing 120, as shown in FIG. 2. In another embodiment, there are two pins on the hard drive housing 120, each located at the lower, back end on opposing side panels of the hard drive housing. In other embodiments, the pin 200 can be any type of protrusion, tab, peg, or piece that extends out from the side of the hard drive housing 120. In some embodiments, a plurality of pins 200 may be located at various positions on the exterior of the hard drive housing 120. The pin 200 is designed to fit into a slot 300 on the chassis 100, which is described in detail herein.

In other embodiments, the hard drive housing 120 includes an opening 210 on the side of the hard drive housing 120. In some embodiments, the opening 210 can be a hole, aperture, indentation, or cut-out of various shapes or sizes. In certain embodiments, the opening 210 is situated towards the front end of the hard drive housing 120. In one embodiment, the opening 210 is situated in the middle of the side panel of the hard drive housing 120, as shown in FIG. 2. In other embodiments, the hard drive housing 120 includes one or more openings 210, which can be located in various positions on the housing 120. For example, there may be two openings 210, where each opening 210 is located on a side panel of the hard drive housing 120.

Figure 3:
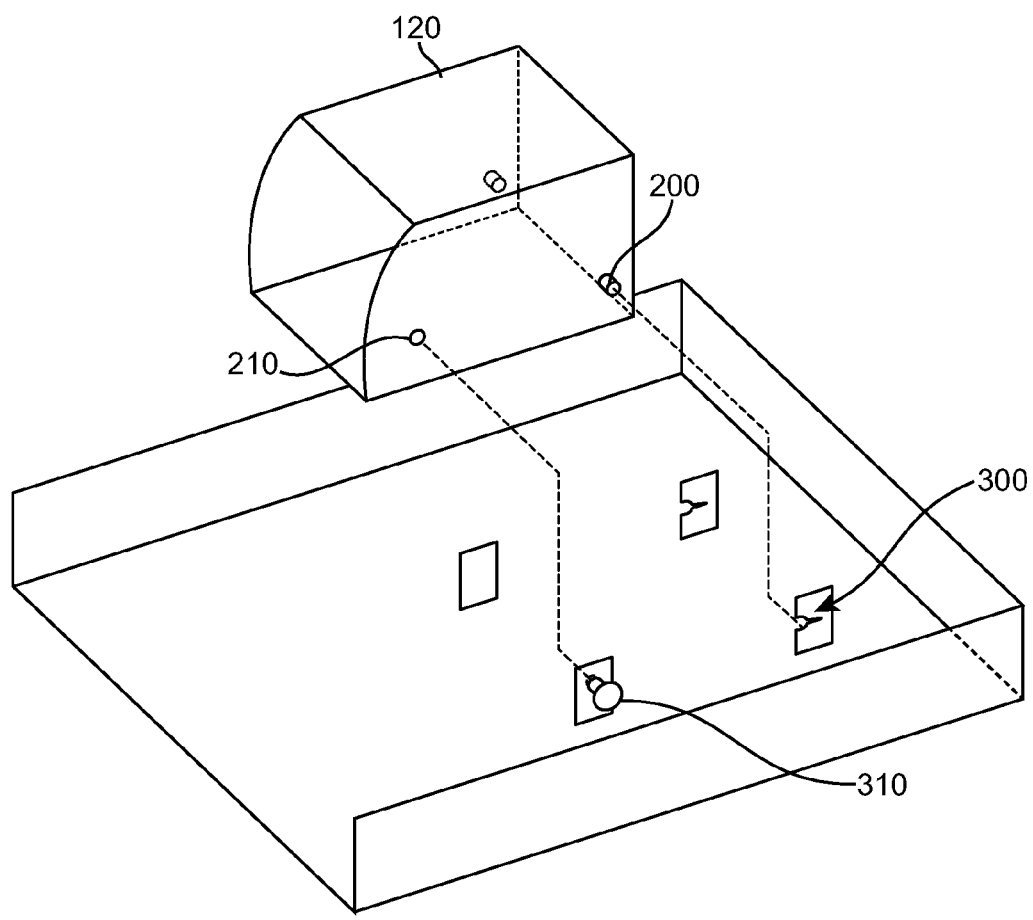
FIG. 3 illustrates the alignment of the components of a retention mechanism, in accordance with one embodiment of the invention.

FIG. 3 depicts an example of the alignment and insertion of the hard drive housing 120 to the chassis 100. First, the hard drive 110 is inserted into the hard drive housing 120, as shown in FIG. 2, and then the hard drive housing 120 is secured to the chassis 100. In one embodiment, the pin 200 on the hard drive housing 120 aligns with and fits into a slot 300 that is situated on a tab on the base panel of the chassis 100. In one embodiment, the chassis 100 has two paired tabs with slots 300 that align with two pins 200 that are each located on the sides of the hard drive housing 120. In one embodiment, the hard drive housing 120 is inserted in between the two tabs with slots 300 on the base panel of the chassis 100, and the pins 200 are fitted into the slots 300 to secure the back end of the hard driving housing 120 to the chassis 100. The insertion of the pins 200 into the slots 300 are described in detail herein.

In some embodiments, the chassis 100 includes a spring loaded plunger 310 that is located on a tab 320 situated on the base panel of the chassis 100. The spring loaded plunger 310 aligns with the opening 210 in the hard drive housing 120. The spring loaded plunger 310 inserts into the opening 210 of the hard drive housing 120 to secure the hard drive housing 120 to the chassis 100. In certain embodiments, there are two paired tabs 320 that are aligned with the exterior of the side panels of the hard drive housing 120 and hold the hard drive housing 120 in place on the chassis 100. In other embodiments, each of the tabs include a spring loaded plunger 310, and each spring loaded plunger 310 inserts into an opening on the side panel of the hard drive housing 120. In another embodiment, the chassis 100 includes a plurality of spring loaded plungers 310 or other spring apparatuses.

Figure 4:
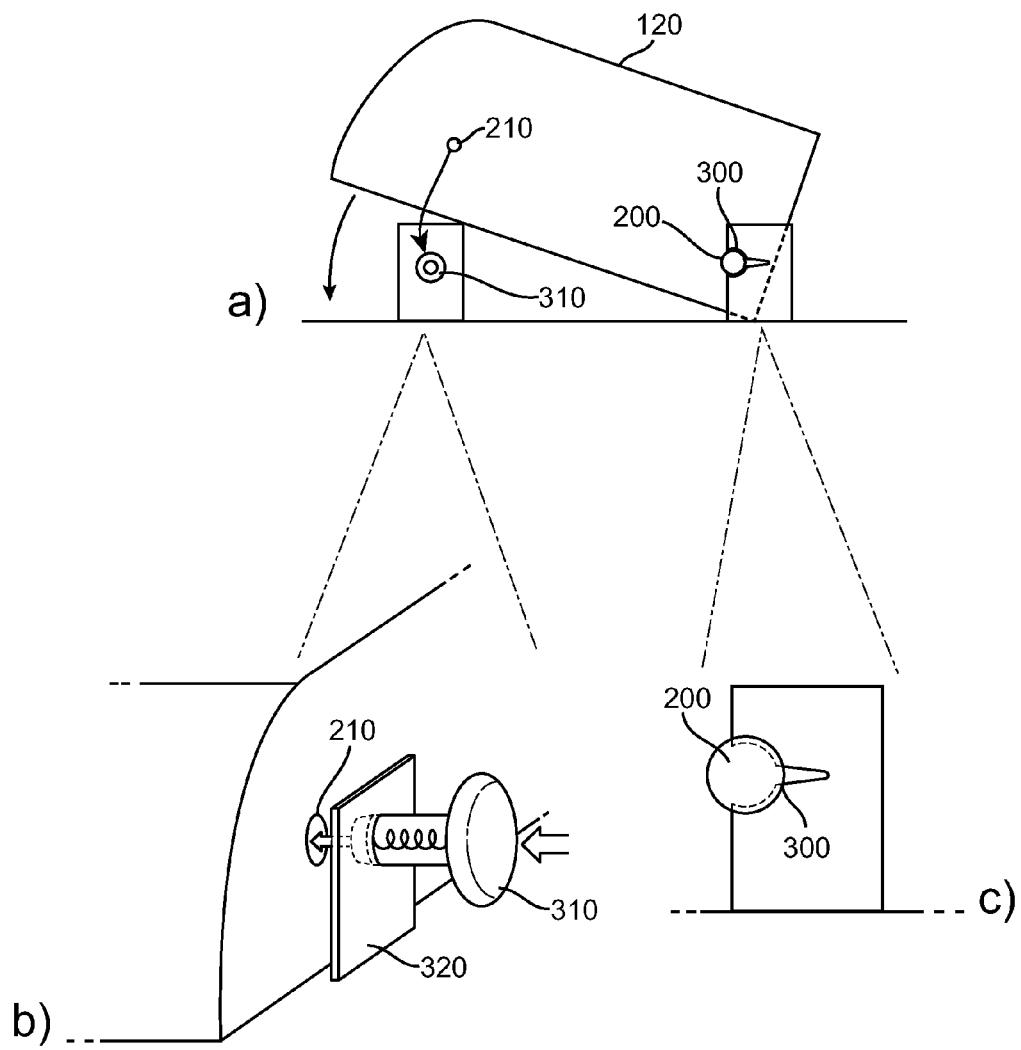
FIGS. 4a-c show components of the retention mechanism comprising a spring plunger and a pin-slot apparatus, in accordance with one embodiment of the invention.

Referring now to FIG. 4, the retention mechanism of the hard drive housing 120 to the chassis 100 is shown. In FIG. 4a, the pin 200 is inserted into the slot 300 situated on the tab, according to one embodiment. In some embodiments, the diameter of the slot 300 is no larger than the diameter of the pin 200. In other embodiments, the diameter of the pin 200 is slightly larger than the diameter of the slot 300. The slot 300 includes an extended slit-like opening that allows the slot 300 to expand in size to fit the diameter of the pin 200. The insertion of the pin 200 into the slot 300 results in an interference fit, which creates friction between the slot 300 and the pin 200 and secures the hard drive housing 120 to the chassis 100. The interference fit between the slot 300 and the pin 200 allows for a secure hold of the hard drive housing 120 and reduces or removes vibration and movement between the hard drive housing 120 and the chassis 100.

Various other types and designs of pins 200 and slots 300 can be used to secure the hard drive housing 120 to the chassis 100. One of skill in the art may alter the pin 200 and slot 300 without departing from the spirit and scope of the invention.

In other embodiments, the hard drive housing 120 is secured to the chassis 100 by a spring loaded plunger 310. The spring loaded plunger 310 provides an advantage of quickly and efficiently securing the hard drive housing 120 to the chassis.

The spring loaded plunger 310 can be extended or shortened (e.g., inserted or removed from the opening 210) based on the movement of an internal spring. In one embodiment, the spring loaded plunger 310 is inserted into the opening 210 to secure the front end of the hard drive housing 120. In some embodiments, the spring loaded plunger 310 is pulled out from the opening 210 to allow for the insertion of the hard drive housing 120 onto the chassis 100, and then the spring loaded plunger 310 is released into the opening 210 to secure the housing 120. Similarly, the spring loaded plunger 310 can be pulled out from the opening 210 in order to remove the hard drive housing 120 from the chassis 100. In some embodiments, the spring loaded plunger 310 is accessible from an opening in the side panel of the chassis, as shown in FIG. 1. Other embodiments include various spring-type devices that allow a plunger to be inserted and removed from an opening 210 in the hard drive housing 120.

In another embodiment, a resilient notch 500 can be used to secure the hard drive housing 120, instead of a spring loaded plunger 310. FIGS. 5a-c show a front cut-out view of a hard drive housing 120 that is being placed on the chassis 100. FIG. 5a shows two tabs 320 that are situated on the base panel of the chassis 100. The two tabs 320 align with the exterior of the side panels of the hard drive housing 120. As shown in FIG. 5b, the hard drive housing 120 is inserted between the tabs 320, and the notch 500 is pushed out 510 by the hard drive housing 120. Referring to FIG. 5c, when the notch 500 aligns with the opening 210 in the hard drive housing 120, the notch 500 returns back 520 into a straight position on the tab 320. The notch 500 protrudes 520 into the opening of the hard drive housing 120 and secures or locks the hard drive housing 120 in place. In certain embodiments, the insertion of the notch 500 into the hard drive housing 120 prevents any movement or vibration of the hard drive housing 120, as shown in FIG. 5c. In some embodiments, the notch 500 can be pulled or pushed outward from the opening 210 to easily detach the hard drive housing 120 from the chassis 100.

FIG. 5d depicts the combined retention mechanisms of the pin 200 within the slot 300 and the notch 500 within the opening 210 of the hard drive housing 120. The retention mechanisms are beneficial for providing a secure hold of the entire hard drive housing 120 without vibration or movement of the hard disk 110, as well as easy removal of the housing 120.

Various other types of notches 500, such as spring plunger mechanisms 310 or similar retention apparatuses, may be used to secure the hard drive housing 120 and hard drive 110 to the chassis 100. One of skill in the art may alter the notches 500 without departing from the spirit and scope of the invention.

In some embodiments, the retention mechanism comprises a combination of one or more pins 200 and slots 300, one or more spring loaded plungers 310, one or more notches 500 and one or more openings 210 in the hard drive housing 120. The location and position of the pins 200, slots 300, spring loaded plungers 310, notches 500 and openings 210 can vary on the chassis 100 or hard drive housing 120, such that the hard drive housing 120 is secured tightly and can be removed easily from the chassis 100.

The hard drive retention mechanisms of the present invention and many of its advantages will be understood by the foregoing description, and it will be apparent that various changes or adaptations may be made in the form, construction, or arrangement of the components thereof, without departing from the scope and spirit of the invention.

The foregoing description of the embodiments of the invention has been presented for the purpose of illustration; it is not intended to be exhaustive or to limit the invention to the precise forms disclosed. Persons skilled in the relevant art can appreciate that many modifications and variations are possible in light of the above disclosure.

Finally, the language used in the specification has been principally selected for readability and instructional purposes, and it may not have been selected to delineate or circumscribe the inventive subject matter. It is therefore intended that the scope of the invention be limited not by this detailed description, but rather by any claims that issue on an application based hereon. Accordingly, the disclosure of the embodiments of the invention is intended to be illustrative, but not limiting, of the scope of the invention, which is set forth in the following claims.

What is claimed is:

1. A system comprising:
a chassis for retaining components of a computing system, including a hard disk drive;
a hard disk drive housing configured to encase one or more hard disk drives, wherein the housing has a pair of pins located on the exterior of the housing and at least one opening;
a pair of tabs fixed to the chassis, each tab including a slot that is configured to receive a pin of the pair of pins of the housing, the slot in each tab including a slit-like opening for allowing expansion of the slot to fit a diameter of one of the pins to provide an interference fit between the slot and the pin; and
a member resiliently fixed to the chassis, wherein the member is configured to fit within the at least one opening of the housing and capable of deforming to be removed from the at least one opening of the housing,
wherein the tabs and the member are located on the chassis so that the pins of the housing can be aligned with and coupled to the slots of the tabs while the member is aligned with and coupled to the at least one opening in the housing to secure the housing to the chassis.

2. The system of claim 1, wherein the pins create an interference fit when inserted into the slots.

3. The system of claim 1, wherein the diameter of slots is not larger than the diameter of the pins.

4. The system of claim 1, wherein the pins are located on opposite sides of the housing.

5. The system of claim 1, wherein the member comprises a spring plunger that is arranged to move against a spring force to remove the spring plunger from the at least one opening of the housing.

6. The system of claim 5, wherein the spring plunger is insertable into the at least one opening of the housing to secure the housing to the chassis.

7. The system of claim 1, wherein the pin and the at least one opening are located on a same side of the housing.

8. A system comprising:
a chassis for receiving a data storage device;
a housing for the data storage device, wherein the housing has at least one protruding portion located on the exterior of the housing and an opening in the housing;
at least one receiving portion on the chassis, wherein the at least one receiving portion aligns with the at least one protruding portion, wherein the at least one protruding portion can be coupled with the at least one receiving portion to secure the housing to the chassis, wherein one of the receiving portions is a tab fixed to the chassis having a slot with a slit-like opening for allowing expansion of the slot to fit a diameter of one of the protruding portions to provide an interference fit between the receiving portion and the protruding portion; and
a member resiliently fixed to the chassis, wherein the member can be aligned and coupled with the opening in the housing when the at least one protruding portion is coupled with the at least one receiving portion.

9. The system of claim 8, wherein the at least one receiving portion is configured to apply compression to the at least one protruding portion when inserted into the receiving portion.

10. The system of claim 8, further comprising multiple protruding portions on the housing.

11. The system of claim 10, further comprising multiple receiving portions located on the chassis for receiving the multiple protruding portions.

12. The system of claim 8, wherein the at least one protruding portion comprises a pin and the at least one receiving portion comprises a slot.

13. The system of claim 8, wherein the member comprises a spring apparatus that can be inserted into the opening of the housing to secure the housing to the chassis.

14. The system of claim 13, wherein the spring apparatus can be removed from the opening of the housing to remove the housing from the chassis.

15. The system of claim 8, wherein the at least one protruding portion can be removed from the at least one receiving portion to remove the housing from the chassis.

16. A system comprising:
a chassis for retaining a hard disk drive;
a housing for the hard disk drive, wherein the housing comprises a plurality of pins and an opening on one or more sides of the housing;
a plurality of slots having diameters not larger than the diameters of the plurality of pins, the slots on the chassis for receiving the plurality of pins, wherein the plurality of slots couple with the plurality of pins, at least one of the slots including a slit-like opening for allowing expansion of the slot to fit a diameter of one of the pins to provide an interference fit between the slot and the pin; and
a spring plunger on the chassis, wherein the spring plunger inserts into the opening,
wherein the coupling of the plurality of pins with the plurality of slots and the insertion of the spring plunger into the opening secures the housing to the chassis.

17. The system of claim 16, wherein uncoupling of the plurality of pins from the plurality of slots allows removal of the housing from the chassis.

18. The system of claim 16, wherein removal of the spring plunger from the opening allows release of the housing from the chassis.

19. The system of claim 1, wherein the member comprises a resilient member.

20. The system of claim 8, wherein the member comprises a resilient member capable of deforming to be uncoupled from the opening.

21. The system of claim 1, wherein the member resiliently fixed to the tab is further configured to remain fixed to the tab during removal from the at least one opening of the housing.

22. The system of claim 1, wherein the slot in each tab has an opening positioned on a side of the tab facing the member resiliently fixed to the chassis, the opening on each tab positioned to receive a horizontal entry of the pin into the slot.

23. The system of claim 1, wherein the resilient fixture of the member resiliently fixed to the tab is configured such that the member is capable of being pulled out from the opening in the tab to allow for insertion or removal of the hard disk drive housing and is capable of being released to snap back into the opening based on movement of an internal spring.

* * * * *